US012033859B2

(12) United States Patent
Bacquie et al.

(10) Patent No.: US 12,033,859 B2
(45) Date of Patent: Jul. 9, 2024

(54) METHOD OF FORMING THE SPACERS ON LATERAL FLANKS OF A TRANSISTOR GATE USING SUCCESSIVE IMPLANTATION PHASES

(71) Applicant: COMMISSARIAT A L'ENERGIE ATOMIQUE ET AUX ENERGIES ALTERNATIVES, Paris (FR)

(72) Inventors: Valentin Bacquie, Grenoble (FR); Nicolas Posseme, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 157 days.

(21) Appl. No.: 17/652,324

(22) Filed: Feb. 24, 2022

(65) Prior Publication Data

US 2022/0270880 A1    Aug. 25, 2022

(30) Foreign Application Priority Data

Feb. 25, 2021    (FR) ...................................... 21 01864

(51) Int. Cl.
*H01L 21/28*     (2006.01)
*H01L 21/3115*   (2006.01)

(52) U.S. Cl.
CPC .. *H01L 21/28123* (2013.01); *H01L 21/31155* (2013.01)

(58) Field of Classification Search
CPC ...................... H01L 21/28123; H01L 21/31155
USPC ......................................................... 438/595
See application file for complete search history.

(56) References Cited

U.S. PATENT DOCUMENTS

| 4,652,334 | A | * | 3/1987 | Jain ........................ C03C 15/00 |
| | | | | 257/E21.248 |
| 9,570,317 | B2 | | 2/2017 | Posseme et al. |
| 9,583,339 | B2 | * | 2/2017 | Posseme ........... H01L 21/30604 |
| 9,947,541 | B2 | | 4/2018 | Pollet et al. |
| 9,947,768 | B2 | | 4/2018 | Posseme |
| 10,043,890 | B2 | | 8/2018 | Pollet et al. |
| 10,446,408 | B2 | | 10/2019 | Posseme |
| 2016/0020152 | A1 | | 1/2016 | Posseme |

(Continued)

FOREIGN PATENT DOCUMENTS

| EP | 3107118 A1 | 12/2016 |
| EP | 2939262 B1 | 1/2019 |

(Continued)

*Primary Examiner* — Quoc D Hoang
(74) *Attorney, Agent, or Firm* — Oblon, McClelland, Maier & Neustadt, L.L.P.

(57) ABSTRACT

A method is provided for forming spacers of a gate of a transistor, including: providing an active layer surmounted by a gate; forming a dielectric layer covering the gate and the active layer, the dielectric layer having lateral portions and basal portions; anisotropically modifying the basal portions by implantation of light ions, forming modified basal portions; and removing the modified basal portions by selective etching, so as to form the spacers on the lateral flanks of the gate from the unmodified lateral portions, in which, before the removing step, the anisotropic modification of the basal portions includes n successive implantation phases having implantation energies $\Gamma i$ (i=1 ... n) which are distinct from each other, the n phases being configured to implant the light ions at different nominal implantation depths.

16 Claims, 8 Drawing Sheets

(56) References Cited

U.S. PATENT DOCUMENTS

2016/0372331 A1  12/2016  Posseme
2020/0251569 A1   8/2020  Posseme

FOREIGN PATENT DOCUMENTS

EP         3107125  B1   1/2020
EP         3671857  A1   6/2020

* cited by examiner

METHOD OF FORMING THE SPACERS ON LATERAL FLANKS OF A TRANSISTOR GATE USING SUCCESSIVE IMPLANTATION PHASES

TECHNICAL FIELD

The present invention relates in general to the field effect transistors (FETs) used by the microelectronics industry and more particularly to the production of gate spacers of metal-oxide-semiconductor type transistors (MOSFETs) mainly used for the production of all kinds of integrated circuits.

STATE OF THE ART

The CMOS (Complementary Metal Oxide Semiconductor) technology, based on the use of complementary n-type and p-type MOSFET transistors, commonly uses SOI (silicon on insulator) type substrates to increase the transistor performance.

A SOI substrate, which comprises a thin surface layer of monocrystalline silicon called topSi lying on a buried silicon oxide layer called BOX (acronym for "buried oxide layer"), allows in particular drastically reducing the parasitic capacitances of the transistors.

In order to further improve the performance of the transistors, it is advantageous that the channel of the transistor in the topSi can be fully depleted (FD) from carriers. To achieve this, it is generally necessary that the topSi is very thin, typically less than 10 nm thick. This type of substrate is thus designated by the acronym FDSOI.

Such a thickness makes certain steps of manufacturing the transistors critical, in particular the formation of the spacers on the lateral flanks of the gate of the transistors.

As illustrated in FIGS. 1A, 1C, the spacers are indeed typically formed by anisotropic etching of a dielectric layer 3 covering the gates 20 of the transistors. This etching allows etching basal portions 30*b* of the dielectric layer 3, which extend mainly parallel to the base plane of the substrate 1, while retaining lateral portions 30*l* of the dielectric layer 3 which extend on the lateral flanks 22 of the gate 20. The latter thus form the gate spacers E of the transistors.

The anisotropic etching must thus allow removing the basal portions 30*b* by exposing the topSi 13, without damaging the topSi 13 and while retaining the lateral portions 30*l*.

The etch stop at the interface 131 between the dielectric layer 3 and the topSi 13 is a major issue in the formation of the spacers.

If the etching is extended for too long, the topSi may be partially consumed or damaged. On the contrary, if it is not sufficiently extended, the spacers may have etching feet which are detrimental to the accurate definition of the critical dimensions of the spacers.

In order to avoid a compromise which is difficult to find between these two antagonistic conditions during the direct etching of the basal portions, the document EP 3107125 B1 provides for a preliminary step of modifying the basal portions 30*b* by implantation of light ions (FIG. 1B), followed by a step of removing the modified basal portions 31*b*, selectively from the unmodified lateral portions 30*l* (FIG. 10). This allows relieve the stresses on the etch stop. The etching accuracy is thus improved.

In practice, however, such a solution does not prove to be optimal. The etching accuracy remains perfectible. The transistor performance can still be improved.

An object of the present invention is to overcome the limitations of the known solutions.

Another object of the present invention is to propose a method for manufacturing spacers allowing a better control of the etch stop at the interface between the dielectric layer and the topSi.

The other objects, features and advantages of the present invention will become apparent on examining the following description and the accompanying drawings. It is understood that other benefits may be incorporated.

SUMMARY

In order to achieve this objective, according to one embodiment, a method is provided for forming the spacers of a gate of a transistor located on an active layer made of a semiconductor material, comprising:
  a provision of a stack comprising the active layer and the gate, said gate having a top and lateral flanks,
  a formation of a dielectric layer made of a dielectric material covering the gate and at least partially the active layer on either side of the gate, said dielectric layer having lateral portions covering the lateral flanks of the gate, and basal portions covering the top and the active layer, the basal portions having a thickness eb,
  an anisotropic modification of the basal portions of said dielectric layer by implantation of light ions in a direction parallel to the lateral flanks of the gate, forming modified basal portions based on the modified dielectric material and unmodified lateral portions based on the unmodified dielectric material,
  a removal of the modified basal portions by selective etching of the modified dielectric material relative to the unmodified dielectric material and relative to the semiconductor material, so as to form the spacers on the lateral flanks of the gate from the unmodified lateral portions, Advantageously, before removal, the anisotropic modification of the basal portions comprises n successive implantation phases having implantation energies Γi (i=1 ... n) of the light ions which are distinct from each other, n≥3, said n phases being configured to implant the light ions at different nominal implantation depths dpi (i=1 ... n) in the basal portions.

Advantageously, each implantation phase is performed from a plasma, for example within a capacitively coupled plasma (CCP) reactor or an inductively coupled plasma (ICP) reactor, or by immersion in the plasma.

The implementation of a plasma to carry out each implantation is intrinsically very different from an implantation carried out within an ion implanter. The characteristics of a method implemented by plasma cannot be transposed in a trivial manner to a method implemented via an implanter, and conversely. The present invention relates only to the specific field of plasma implantation. In the context of the development of the present invention, it has been observed that a single plasma implantation of light ions as disclosed by the known solutions led either to a first situation illustrated in FIGS. 2A, 2B, 2C, or to a second situation illustrated in FIGS. 2A, 2D, 2E. In the first situation, the basal portion 30*b* has a thickness eb (FIG. 2A) and the implantation is configured to implant light ions over the entire thickness eb. It appears that the implantation profile of the light ions in the modified basal portion 31*b* has a maximum md at an implantation depth dp, and a distribution tail qd located above the interface 131 (FIG. 2B). The modified basal portion 31*b* thus has a maximum concentration of light ions at the depth dp, which then decreases as it approaches the interface 131 with the underlying active layer 13. The concentration of light ions then becomes too low in the vicinity of the interface 131, such that a portion 32b of modified basal portion is not etched during the selective etching of the modified dielectric material relative to the unmodified dielectric material (FIG. 2C).

In the second situation, the implantation is configured to implant light ions on a depth which is greater than the thickness eb. The maximum md is displaced in the direction of the interface 131 and the distribution tail qd of the implantation profile is herein located below the interface 131 (FIG. 2D and FIG. 3). The concentration of light ions becomes sufficient over the entire thickness eb, such that the entire modified basal portion 31b is removed during the selective etching of the modified dielectric material relative to the unmodified dielectric material (FIG. 2E). Such an implantation is however detrimental to the underlying active layer 13. A portion 33b of active layer 13 located under the interface 131 therefore has a significant concentration of light ions, from the distribution tail qd of the implantation profile. This adversely affects the structural and/or electrical properties of the active layer 13.

Unlike the known solutions which advocate a modification by a single implantation immediately followed by removal of the modified basal portions, the method according to the invention provides for a series of successive implantation phases at different implantation energies to modify the basal portions along the thickness eb, prior to the removal of said modified basal portions.

Such a series of implantation phases allows better controlling the distribution tail of the light ions in the thickness of the basal portions, before removal. This allows improves the distribution of light ions along the thickness eb of the basal portions. The variation in concentration of light ions along the thickness of the basal portions can be advantageously reduced. Ideally, the nominal implantation depths of the light ions are chosen so as to obtain a regular distribution of the light ions along the thickness eb of the basal portions.

This can in particular allow obtaining a more constant light ion concentration profile along the thickness eb, and more abrupt at the interface between the modified basal portions and the active layer. The modification of the dielectric material is therefore more homogeneous according to the thickness eb, and has less impact on the underlying active layer. A relatively homogeneous or constant concentration of light ions allows obtaining a substantially constant etch rate during removal. The removal by etching of the modified basal portions is thus better controlled. The etch stop at the interface is made easier.

The active layer is preserved.

The series of successive implantation phases typically comprises at least one implantation phase called "low energy" implantation phase, for example at an implantation energy less than or equal to 50 eV, at least one implantation phase called "high energy" implantation phase, for example at an implantation energy greater than or equal to 200 eV, and at least one implantation phase called "intermediate" implantation phase, for example at an implantation energy comprised between 50 eV and 200 eV. The light ion implantation profile is thus smoothed along the thickness eb of the basal portions.

This method typically allows producing foot-free spacers and without damaging the underlying active layer.

BRIEF DESCRIPTION OF THE FIGURES

The aims, objects, as well as the features and advantages of the invention will emerge better from the detailed description of embodiments thereof which are illustrated by the following accompanying drawings in which.

Figure 1A:
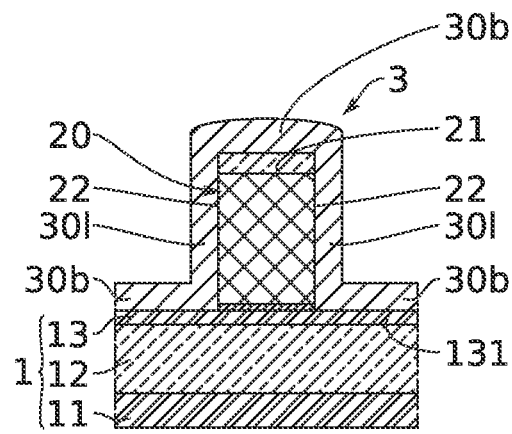
FIGS. 1A to 1C schematically illustrate steps of a method for forming spacers according to the prior art.
Figure 1B:
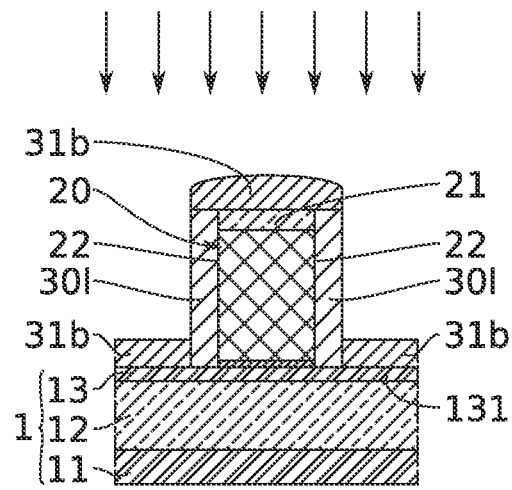
Figure 1C:
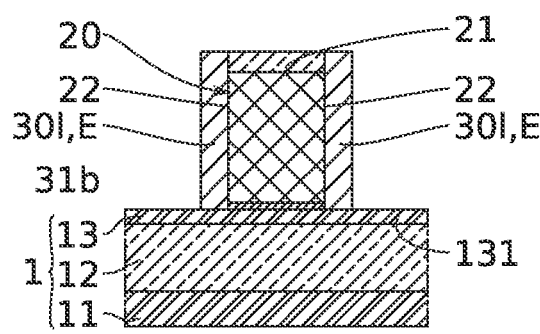
Figure 2A:
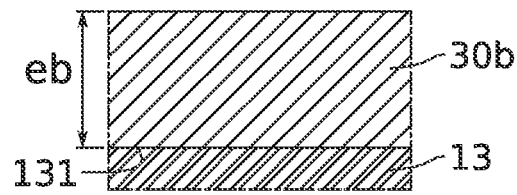
FIGS. 2A to 2E schematically illustrate different issues relating to the method for forming spacers according to the prior art.
Figure 2B:
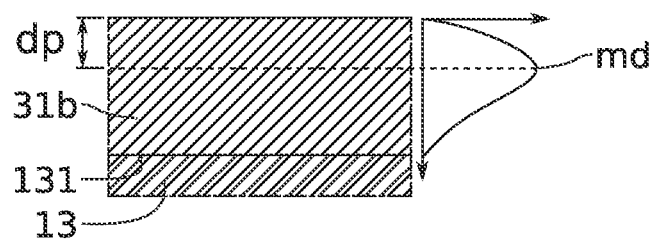
Figure 2C:
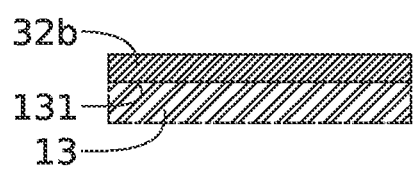
Figure 2D:
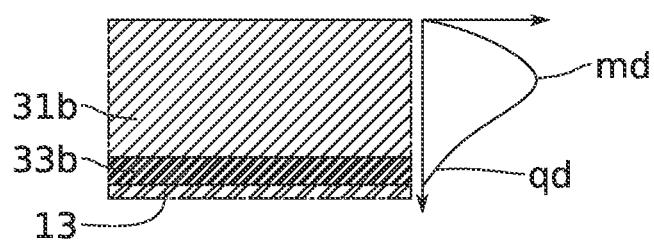
Figure 2E:
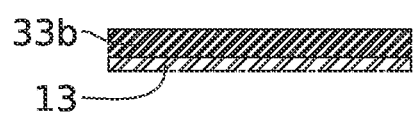

The drawings are given by way of examples and are not limiting to the invention. They constitute schematic representations of principle intended to facilitate the understanding of the invention and are not necessarily on the scale of the practical applications. In particular, on the principle diagrams, the thicknesses of the different layers and portions, and the dimensions of the patterns are not representative of reality.

DETAILED DESCRIPTION

Before starting a detailed review of embodiments of the invention, optional features are set out below which may possibly be used in combination or alternatively:

According to one example, the n successive implantation phases are configured to modify the basal portions along the entire thickness eb and preferably, without structurally modifying the active layer. The concentration of light ions in the active layer remains significantly lower than that resulting from a single plasma implantation. The active layer is preserved.

According to one example, the n implantation phases are configured so that the modified basal portions have, after modification, a variation in total concentration of light ions [H]tot less than 20% along the thickness eb.

According to one example, the number of implantation phases n is equal to 3 and the implantation energies $\Gamma1, \Gamma2, \Gamma3$ are such that $\Gamma1 \leq 0.5 \cdot \Gamma2$ and $\Gamma2 \leq 0.6 \cdot \Gamma3$.

According to one example, each implantation phase is configured to implant light ions at a maximum concentration [H]i(dpi) at the implantation nominal depth dpi.

According to one example, the implantation nominal depths are selected such that $dpi = eb \cdot i/(i+1)$. This allows implanting a sufficient dose of light ions at different depths to ensure good etching selectivity during the removal. The basal portions can be etched over their entire thickness.

According to one example, the anisotropic implantation is performed by immersion in a plasma based on species forming the light ions In one example, the light ions are hydrogen (H) based ions.

According to one example, the anisotropic implantation is performed by plasma based on species forming the light ions, in a capacitively coupled plasma reactor.

According to one example, the anisotropic implantation is performed by plasma based on species forming the light ions, in an inductively coupled plasma reactor.

According to one example, the plasma is formed from dihydrogen (H2) and at least one species X promoting the dissociation of dihydrogen to form said light ions, said at least one species X being taken from argon, nitrogen, xenon, helium.

According to one example, each implantation energy $\Gamma i$ (i=1 . . . n) is maintained for a duration ti≥5 s, so that the successive implantation phases form bearings of duration ti and implantation energy $\Gamma i$ (i=1 . . . n).

According to one example, the implantation energies $\Gamma i$ (i=1 . . . n) are such that $\Gamma i+1=\Gamma i+\Delta$, with $\Delta$ an energy step such that $\Delta \geq 30$ eV, preferably $\Delta \geq 50$ eV.

According to one example, the n implementation phases are configured to each last a duration ti (i=1 . . . n)≥T/2(n+1), where T is a total duration of the modification.

According to one example, the implantation energies $\Gamma i$ (i=1 . . . n) vary continuously and monotonously between $\Gamma 1$ and $\Gamma n$ during the anisotropic modification.

According to one example, the implantation energies $\Gamma i$ (i=1 . . . n) are comprised between 20 eV and 300 eV.

According to one example, the implantation phases are performed in increasing order of implantation energy.

According to one example, the successive implantation phases have an implantation energy variation which is greater than or equal to 20%, such as $0.8 \cdot \Gamma i-1 \leq \Gamma i \leq 1.2 \cdot \Gamma i+1$ with i=1 . . . n.

According to one example, the number of implantation phases n is equal to 6 and the implantation energies are such that $\Gamma 1=50$ eV, $\Gamma 2=100$ eV, $\Gamma 3=150$ eV, $\Gamma 4=200$ eV, $\Gamma 5=250$ eV, $\Gamma 6=300$ eV, each implantation phase being performed for a duration ti (i=1 . . . 6) comprised between 2 s and 20 s According to one example, the light ions are taken from H+, H2+, H3+.

According to one example, the gate is a sacrificial gate pattern used in a method called "gate last" method, where the sacrificial gate pattern is replaced by a functional gate after formation of the spacers.

According to one example, the implantation energy varies continuously from one implantation phase to another.

According to one example, the implantation energy does not vary continuously from one implantation phase to another. It takes discrete values for each implementation phase.

According to one example, the transistor is an FDSOI type transistor. Preferably, the method comprises, after removal of the basal portions on either side of the gate, a step of forming raised source and drain zones from the active layer made of a semiconductor material, for example by epitaxy.

Advantageously, the semiconductor material is silicon. Advantageously, the etching is selective with silicon oxide (SiO2). The semiconductor material can also be germanium (Ge) or silicon-germanium SiGe. The step of removing the modified dielectric layer can be performed by wet etching selectively with Ge or SiGe or and/or with SiGe oxide or Ge oxide.

According to one example, the nature of the light ions and the total dose of light ions implanted during the successive implantation phases are configured so that the modified dielectric material can be etched selectively relative to the unmodified dielectric material.

Advantageously, the modification of the silicon nitride dielectric layer by implantation of hydrogen (H2) allows improving the etching selectivity of this modified layer relative to silicon and/or silicon oxide.

According to one example, the dielectric material is taken from: SiN, Si3N4, SiCO, SiC, SiCN, SiOCN, SiCBN, SiOCH.

Advantageously, the removal of the modified basal portions is made by selective etching of the modified dielectric material relative to the unmodified dielectric material and relative to the semiconductor material.

According to one embodiment, the selective etching of the modified dielectric material is a wet etching using a solution based on hydrofluoric acid (HF) or using a solution based on phosphoric acid (H3PO4).

According to another embodiment, the selective etching of the modified dielectric material is a dry etching, preferably performed in a plasma formed from nitrogen trifluoride (NF3) and ammonia (NH3). The dry etching can typically form solid salts. It is then followed by a step of sublimation of these solid salts.

According to one embodiment, the selective etching of the modified dielectric material comprises:
  a dry etching carried out by exposing the modified basal portions to a gaseous mixture, preferably only gaseous, comprising at least one first component based on hydrofluoric acid (HF), the hydrofluoric acid transforming said modified basal portions into non-volatile residues, at ambient temperature,
  after dry etching, a removal of the non-volatile residues at ambient temperature by a wet cleaning or by thermal sublimation annealing.

Preferably, the removal of the modified basal portions is performed using a solution based on phosphoric acid (H3PO4) or using a solution based on hydrofluoric acid (HF).

Except incompatibility, it is understood that all of the above optional features can be combined to form an embodiment which is not necessarily illustrated or described. Such an embodiment is obviously not excluded from the invention.

The term "Light ions" means ions originating from atom or molecule whose atomic number in the periodic table of elements is low. In general, all elements that can be implanted in the material to be etched, without causing any dislocation of the atomic structure thereof such that it would result in a sputtering of the latter, and therefore without re-deposition of the etched material on the walls of the reactor or the patterns being etched themselves, are likely to be suitable. Preferably, the light ions are based on hydrogen (H) or dihydrogen (H2) or even helium (He).

It is specified that, within the scope of the present invention, the terms "over", "surmounts", "covers", "underlying", "facing" and the equivalents thereof do not necessarily mean "in contact with". Thus, for example, the deposition of a first layer on a second layer does not necessarily mean that the two layers are directly in contact with each other, but means that the first layer at least partially covers the second layer by being either directly in contact therewith, or by being separated therefrom by at least one other layer or at least one other element.

A layer can moreover be composed of several sub-layers of the same material or of different materials.

In the present invention, the unmodified lateral portions may comprise superficially a low concentration of light ions, insofar as there is always in practice a low deflection of the ions relative to the targeted implantation direction. This low concentration is typically not sufficient to "sufficiently" modify the dielectric material, that is to say, so that it can be etched afterwards. Furthermore, this surface layer of the lateral portions is generally very thin, for example at least 10 times less than the thickness of the lateral portions, such that the lateral portions always comprise the unmodified dielectric material stricto sensu. In the present application, the unmodified lateral portions thus designate at least the lateral portions comprising the unmodified dielectric material stricto sensu, and possibly this low-modified surface layer.

The terms "a substrate", "a stack", "a layer", "based on" a material A mean a substrate, a stack, a layer comprising this material A only or this material A and possibly other materials, for example alloy elements and/or doping elements. Thus, a silicon-based layer means for example an Si, n-doped Si, p-doped Si, SiGe layer. A germanium-based layer means for example a Ge, n-doped Ge, p-doped Ge, SiGe layer.

The word "dielectric" describes a material whose electrical conductivity is low enough in the given application to be used as an insulator. In the present invention, a dielectric material preferably has a dielectric constant of less than 7. The modified dielectric material is known to be different from the unmodified dielectric material.

In general, but without limitation, a spacer forms a ring around the gate, with a closed contour; it is therefore possible to speak of a single spacer around the gate; however, the sectional representations, and the privileged directions of the gates, are also referred to as pairs of spacers (or first and second spacers), terminology retained herein.

Several embodiments of the invention implementing successive steps of the manufacturing method are described below. Unless explicitly mentioned, the adjective "successive" does not necessarily imply, even if this is generally preferred, that the stages follow each other immediately, intermediate steps being able to separate them.

Moreover, the term "step" means carrying out a part of the method, and may designate a set of sub-steps.

Moreover, the term "step" does not necessarily mean that the actions carried out during a step are simultaneous or immediately successive. Certain actions of a first step can in particular be followed by actions linked to a different step, and other actions of the first step can be repeated later. Thus, the term "step" does not necessarily mean unitary and inseparable actions in time and in the sequence of the phases of the method.

A preferably orthonormal reference frame, comprising the axes x, y, z is represented in the appended Figures. When only one reference frame is represented on the same sheet of figures, this reference applies to all Figures of this sheet.

In the present patent application, the thickness of a layer is taken along a direction normal to the main extension plane of the layer. Thus, a layer typically has a thickness along z. The relative terms "over", "surmounts", "under", "underlying" refer to positions taken in the direction z.

The terms "vertical", "vertically" refer to a direction along z. The terms "horizontal", "horizontally" refer to a direction in the xy plane. The term "lateral" refers to an xz plane. Thus, the lateral flanks of the gate extend parallel to an xz plane.

An element located "in line with" or "perpendicular to" another element means that these two elements are both located on the same line perpendicular to a plane in which a lower or upper face of a substrate mainly extends, that is to say on the same line oriented vertically in the figures.

Figure 4A:
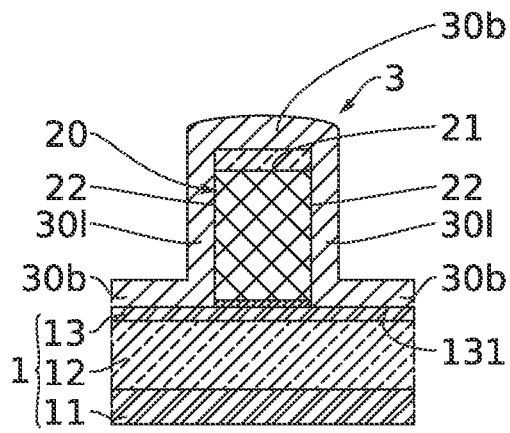
FIGS. 4A to 4E schematically illustrate steps of a method for forming spacers according to one embodiment of the present invention.

FIGS. 4A to 4E illustrate an embodiment of the method according to the invention. According to this embodiment, an initial structure illustrated in FIG. 4A is provided.

This structure may typically comprise a substrate 1 comprising an active semiconductor layer 13 based on silicon or germanium. This active layer 13 typically has a thickness in the range of a few nanometres, for example 6 nm to 8 nm.

The substrate 1 may comprise a solid support 11 called "bulk", surmounted by an electrically insulating layer 12, typically an oxide layer called "BOX".

The support 11, the insulating layer 12 and the active layer 13 can form a substrate 1 of the semiconductor on insulator type, for example a silicon on insulator SOI substrate or a germanium on insulator GeO substrate, or even a fully depleted silicon on insulator FDSOI substrate.

The active layer 13 is surmounted by a gate pattern or gate 20.

Conventionally, this gate pattern 20 may successively have the following elements disposed from the active layer 13: an interface oxide layer or a hafnium oxide layer having a high dielectric constant, called high k, a polysilicon gate and a hard mask.

The gate pattern 20 typically has a height along Z from several tens of nanometres to several hundreds of nanometres.

In the remainder of the description, and for the sake of brevity, the gate pattern will subsequently be referred to as gate 20.

As illustrated in FIG. 4A, a dielectric layer 3 made of a dielectric material, for example silicon nitride, covers the gate 20 and the active semiconductor layer 13. The thickness eb of this dielectric layer 3 is preferably substantially constant. It can be comprised between 5 nm and 20 nm, preferably between 7 nm and 12 nm.

This dielectric layer 3 comprises a lateral portion 30*l* on each of the lateral flanks 22 of the gate 20, basal portions 30*b* at the surface of the substrate 1 on either side of the gate 20, in contact with the active layer 13, and a basal portion 30*b* at the top 21 of the gate 20. The lateral portions 30*l* extend along planes perpendicular to the XY plane and the basal portions 30*b* extend along planes parallel to the XY plane.

Figure 4B:
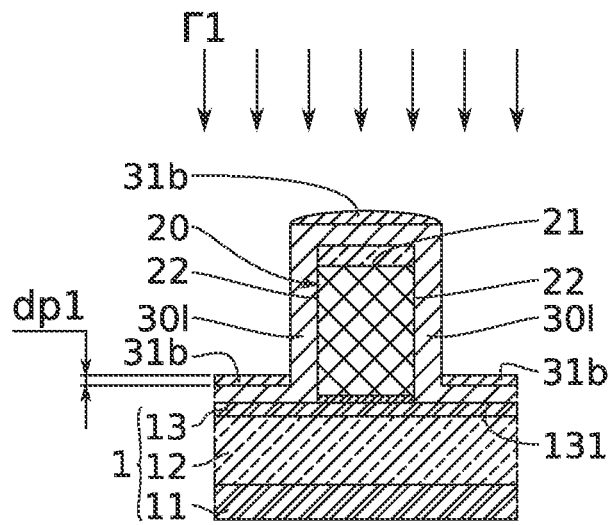
Figure 4C:
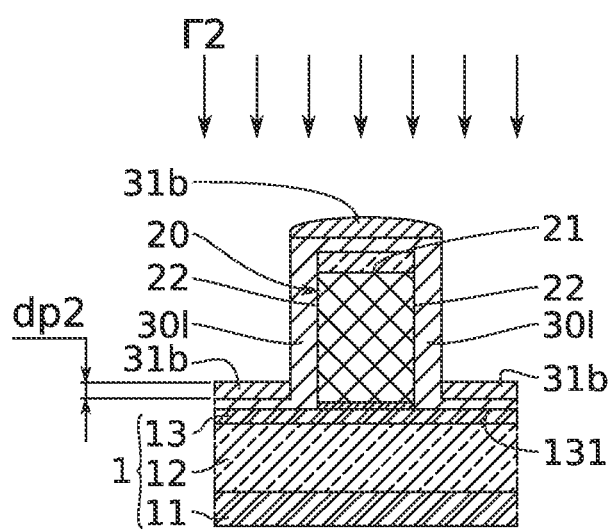
Figure 4D:
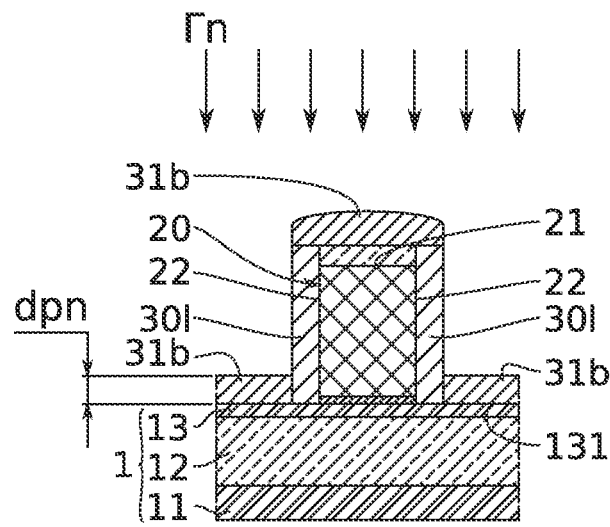
Figure 4E:
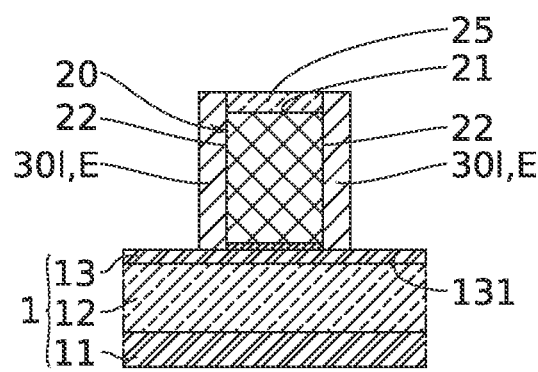

FIGS. 4B to 4D illustrate the anisotropic modification of the basal portions 30*b* of the dielectric layer 3, by successive implantation phases along Z. FIG. 4E illustrates the removal of the modified basal portions 31*b*, after the succession of the different implantation phases.

As illustrated in FIG. 4B, a first implantation phase is performed at an implantation energy $\Gamma 1$. This first implantation phase allows modifying the basal portions 30*b* to a depth dp1. Modified basal portions 31*b* of thickness dp1 are thus obtained.

On the other hand, this first phase does not modify the lateral portions 30*l* located on the flanks 22 of the gate 20, these lateral portions 30*l* being masked by the basal portion 30B located at the top 21 of the gate 20.

A second implantation phase is then performed at an implantation energy $\Gamma 2 \neq \Gamma 1$ FIG. 4C). This second implantation phase allows modifying the basal portions 30*b* to a depth dp2. Modified basal portions 31*b* of thickness dp2 are thus obtained. This second phase does not modify the lateral portions 30*l* located on the flanks 22 of the gate 20.

An n-th implantation phase is then performed at an implantation energy $\Gamma n \neq \Gamma 1, \Gamma 2$ ((FIG. 4D). This n-th implantation phase allows modifying the basal portions 30*b* to a depth dpn. Modified basal portions 31*b* of thickness dpn are thus obtained. This n-th phase does not modify the lateral portions 30*l* located on the flanks 22 of the gate 20.

Advantageously, all n implantation phases are configured so that the thickness dpn of the modified basal portions 31b is equal to the thickness eb of the dielectric layer.

The number n of implantation phases is preferably greater than or equal to 3. At least one low-energy implantation phase, for example at an implantation energy in the range of 20 eV, at least an intermediate implantation phase, for example at an implantation energy in the range of 100 eV to 150 eV, and at least one high-energy implantation phase, for example at an implantation energy in the range of 200 eV to 300 eV.

Figure 5A:
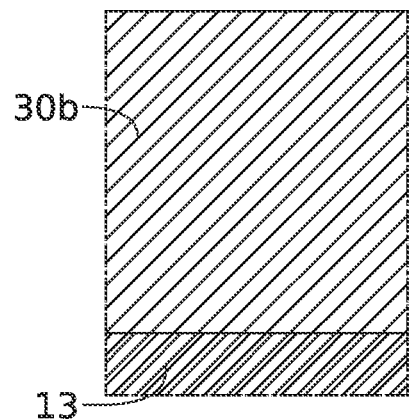
FIGS. 5A to 5D schematically illustrate implantation phases of a method for forming spacers according to an embodiment of the present invention.
Figure 5B:
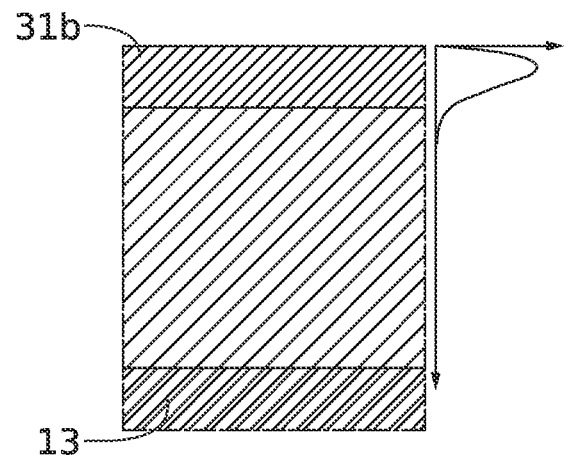
Figure 5C:
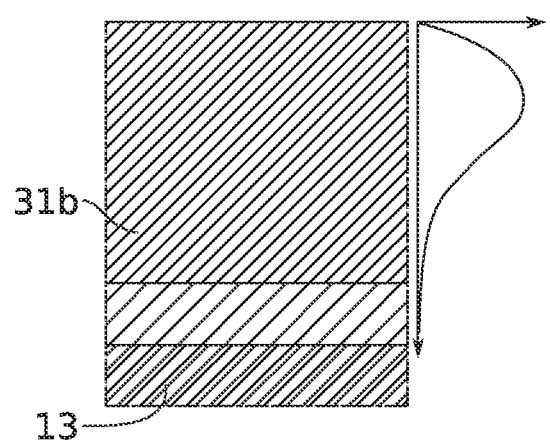
Figure 5D:
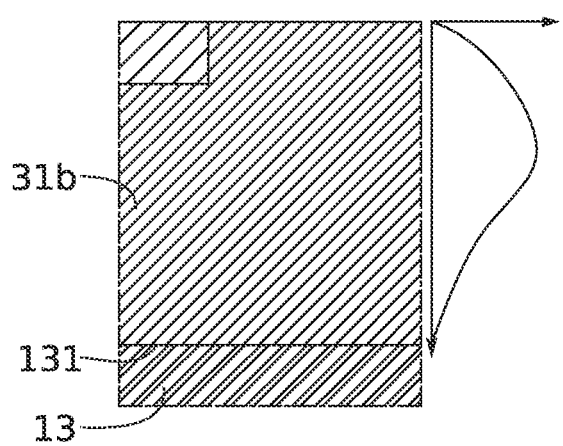

FIGS. 5A to 5D illustrate more specifically what happens at the basal portion 30b during the different implantation phases. The low-energy implantation phase typically allows modifying the first nanometres of the dielectric layer (FIG. 5B). The implantation profile of this low-energy implantation phase has a distribution tail which will contribute to increasing the concentration of more deeply implanted species, during the higher-energy implantation phases (FIGS. 5C, 5D). The implantation profiles of each implantation phase will be typically added to form a steeper final implantation profile at the interface between the modified basal portions of the dielectric layer and the active layer 13. This improves the homogeneity of the total concentration Htot of light ions along the thickness eb of the modified basal portions 31b.

Figure 6A:
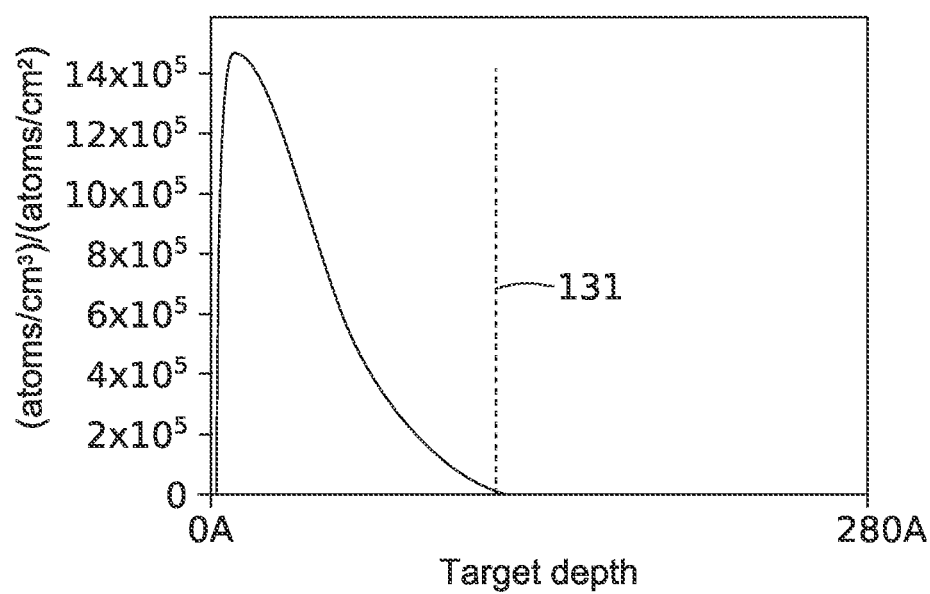
FIG. 6A illustrates the distribution of the light ions according to an implantation profile of one embodiment of the present invention.

FIG. 6A has a simulated implantation profile from successive implantation phases of hydrogen H in Si3N4, for implantation energies between 20 eV and 300 eV in steps of 20 eV. The total dose of light ions is plotted depending on the implantation depth, in a dielectric layer of Si3N4 of thickness eb=12 nm on silicon. The cumulative number of implanted light ions is 15000.

Figure 3:
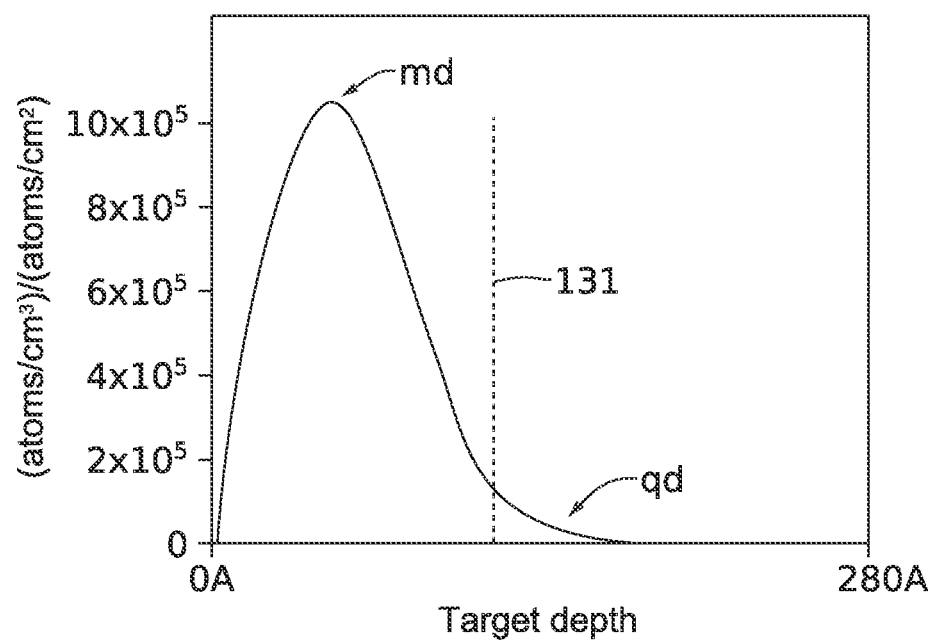
FIG. 3 illustrates the distribution of the light ions according to an implantation profile of the prior art.

This implantation profile in several successive implantation phases can be directly compared to the implantation profile of FIG. 3, simulated for a single 300 eV energy implantation, all other things being equal (same total number of implanted light ions: 15000, same thickness of Si3N4: 12 nm). It appears that in the case of multiple implantation phases at different energies, the implanted light ions are almost absent in the silicon layer underlying the Si3N4 layer. The distribution tail of the implanted light ions remains in the Si3N4 layer, to the left of interface 131 in FIG. 6A.

The implantation conditions related to the different implantation phases can be determined by simulation using a simulation tool of the SRIM (stopping and range of ions matter) or TRIM (transport simulation of ions in matter) type.

Such a simulation allows, for example, defining the maximum and minimum values of the energies $\Gamma i$ and the energy step $\Delta$ in order to control the distribution tail of the light ions implanted relative to the interface between the dielectric layer and the active layer. The different energies of the implantation phases are ideally selected so as to avoid a modification of the active layer.

The implantation energy can vary continuously between two successive implantation phases. Alternatively, the implantation energy can vary discontinuously between two successive implantation phases. It can for example take only discrete values, or only continuous values, or even a mixture of discrete and continuous values during the different successive implantation phases.

Another parameter influencing the total dose of implanted light ions is the duration during which the implantation energy is maintained during each implantation phase.

For each implantation phase, the implantation energy is preferably maintained at the value $\Gamma i$ for a few seconds, for example for at least 2 s or at least 5 s. Energy bearings $\Gamma i$ of duration ti are thus performed during the successive implantation phases. These bearings can all have the same duration, or different durations. They can be reached by continuous variation of energy from one bearing to another, according to an energy ramp, or discontinuously, by energy jump between bearings.

The total duration T of the anisotropic modification thus corresponds to the sum of the durations of the bearings ti, or to the sum of the durations of the bearings ti and to the sum of the durations of the energy ramps between the bearings.

The total duration T and the duration ti of the implantation phases are adjusted so as to control the total dose implanted in the basal portions made of dielectric material. The total duration T of the anisotropic modification can be around 60 s to modify a silicon nitride thickness of 12 nm. This total duration can be reduced depending on the obtained result, in particular if the active layer consumption is greater than 1 nm at the end of the spacer formation method.

Each implantation phase is performed from plasma.

It is possible to use a capacitively coupled plasma (CCP) reactor or an inductively coupled plasma (ICP) reactor, or an immersion plasma.

The following additional parameters can be adjusted for each phase of plasma implantation:
- the pressure inside the plasma reactor chamber. Preferably, this pressure is comprised between 5 milliTorr and 100 milliTorr, this in order to avoid an isotropic implantation;
- the temperature is preferably less than 100° C., in order to effectively modify the dielectric layer 3;
- The plasma bias voltage typically varies between 20V and 300V;
- the power of the plasma source can be adjusted so as to obtain a more or less significant ion flux. A source power comprised between 100 W and 1000 W will typically be selected.
- the plasma source can be radio frequency (RF), with a frequency comprised between 100 Hz to 5 kHz. A duty cycle of 10% to 90% will typically be chosen to reduce the ionic energy.

Preferably, all phases of implantation of the anisotropic modification will be performed in the same equipment, in order to simplify the method and reduce the costs.

According to one embodiment, the used plasma is formed from a gas comprising at least one first non-carbonaceous hydrogenated gaseous component denoted H, whose dissociation generates said light ions and a second gaseous component X comprising at least one species promoting the dissociation of the first component H to form said light ions, in which the gas ratio between the first component and the second component is comprised between 1:19 and 19:1. Preferably said ratio is comprised between 1:9 and 9:1 and preferably between 1:5 and 5:1.

The first component H is preferably selected from dihydrogen (H2), silane (SiH4), hydrogen nitride (NH3) or hydrogen bromide (HBr). The second component X is preferably selected from helium (He), dinitrogen (N2), argon (Ar) or xenon (Xe).

Preferably the flow rate of the first component H is comprised between 10 and 100 sccm (cubic centimetre per minute) and the flow rate of the second component X is preferably comprised between 10 and 500 sccm.

The addition of a second component advantageously acting as a dissociation gas (such as argon, helium, xenon, nitrogen), allows facilitating the dissociation of the first component and by this means, promoting the implantation of said first dissociated component in the dielectric layer, in the form of light ions. The implanted dose is therefore higher without the need to increase the maximum implantation depth.

It is therefore important to find a fair ratio between the content of first component and second component in the plasma intended to modify the dielectric layer. Advantageously, the gas ratio between the first component and the second component is greater than 1:19 and less than 19:1.

These implantation phases allow modifying the dielectric layer 3 without however sputtering it. Thus, it is essentially a chemical modification, the addition of ions in this layer 3 changing the etching selectivity of this layer 3. Thus, the modified basal portions 30b of this layer 3 will etch much more easily than the unmodified lateral portions 30l, the underlying active layer 13 as well as the gate pattern 20.

According to one embodiment, the anisotropic modification comprises 6 implantation phases to modify 12 nm of silicon nitride by ICP etching based on a first component H=H2 and a second component X=He.

The first energy implantation phase Γ1 is typically performed with the following parameters: Pressure=10 mtorr/RF bias voltage=50 V/duration t1=10 s/X flow rate=250 sccm/H2 flow rate=50 sccm/RF power=500 W.

The second energy implantation phase Γ2 is typically performed with the following parameters: Pressure=10 mtorr/RF bias voltage=100 V/duration t2=10 s/X flow rate=250 sccm/H2 flow rate=50 sccm/RF power=500 W.

The third energy implantation phase Γ3 is typically performed with the following parameters: Pressure=10 mtorr/RF bias voltage=150 V/duration t3=10 s/X flow rate=250 sccm/H2 flow rate=50 sccm/RF power=500 W.

The fourth energy implantation phase Γ4 is typically performed with the following parameters: Pressure=10 mtorr/RF bias voltage=200 V/duration t4=10 s/X flow rate=250 sccm/H2 flow rate=50 sccm/RF power=500 W.

The fifth energy implantation phase Γ5 is typically performed with the following parameters: Pressure=10 mtorr/RF bias voltage=250 V/duration t5=10 s/X flow rate=250 sccm/H2 flow rate=50 sccm/RF power=500 W.

The sixth energy implantation phase Γ6 is typically performed with the following parameters: Pressure=10 mtorr/RF bias voltage=300 V/duration t6=10 s/X flow rate=250 sccm/H2 flow rate=50 sccm/RF power=500 W.

The total duration of the anisotropic modification is thus $t_{tot}=\Sigma_{i=1}^{6} t_i=60$ s.

These parameters can be adjusted according to the nature of the basal portions to be etched and the thickness eb.

Figure 7A:
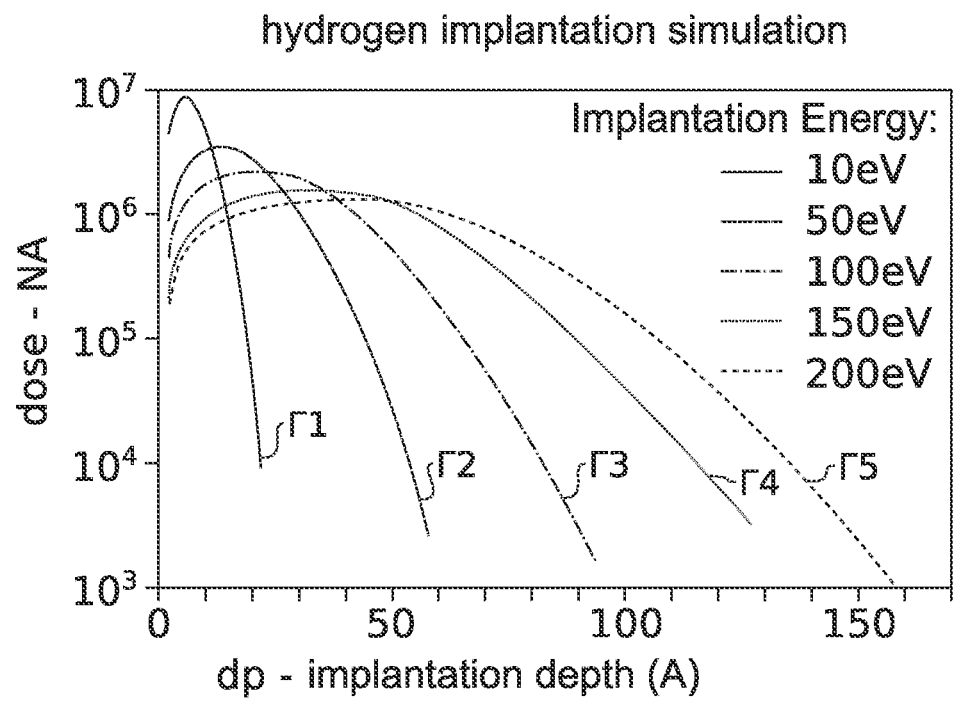
FIG. 7A illustrates simulations of light ion implantation phases according to one embodiment of the present invention.
Figure 7B:
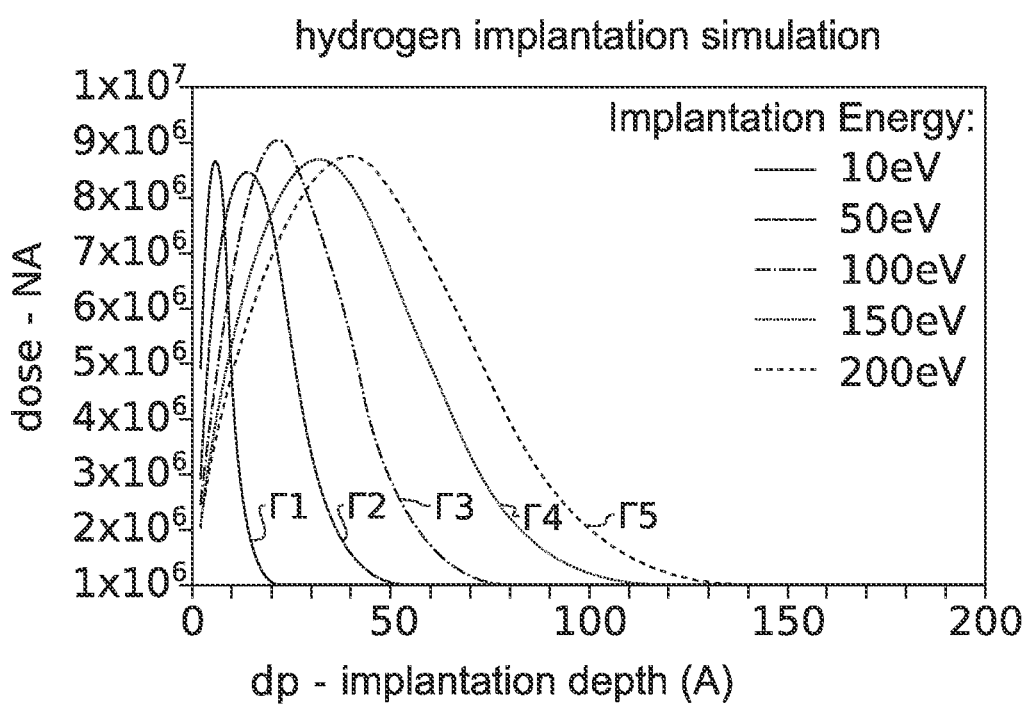
FIG. 7B illustrates simulations of light ion implantation phases according to another embodiment of the present invention.

FIGS. 7A, 7B illustrate the doses of hydrogen implanted in silicon nitride according to the implantation depth dp, obtained by simulation via the SRIM software for energy implantation phases Γ1=10 eV, Γ2=50 eV, Γ3=100 eV, Γ4=150 eV, Γ5=200 eV.

The shape of the total distribution of implantation of hydrogen atoms will thus benefit from the successive distributions of low energy Γ1, intermediate energies Γ2, Γ3, Γ4 and high energy Γ5.

In particular, a low-energy implantation phase can compensate for a deficit in the distribution of high-energy implanted ions. Successive implantation phases thus allow smoothing the total distribution of implanted ions along the depth of the modified basal portions.

This allows obtaining a modification of the basal layers of silicon nitride, more uniform and over a greater thickness, while reducing the impact of the modification on the underlying silicon.

A more uniform modification on the thickness eb of the modified basal portions allows obtaining a more constant etching rate during the selective removal of the modified basal portions. It also decreases the risk of damage of the underlying active layer.

The selective removal of the modified basal portions can be performed by etching according to several variants. Dry or wet etching chemistries can be used.

According to one embodiment, the removal of the modified basal portions 31b is performed by selective wet etching to the semiconductor material of the active layer 13. If the semiconductor material is silicon, then the removal of the modified portions 31b is performed by wet etching selectively with silicon (Si).

Preferably, the selective silicon etching is obtained using a solution based on hydrofluoric acid (HF) or using a solution based on phosphoric acid (H3PO4). For example, in order to remove 15 nm of modified silicon nitride, a 1% HF solution for 60 s or a H3PO4 solution for 45 s can be used.

By way of example for a SiN dielectric layer 3, with a solution based on hydrofluoric acid (HF), the etching rate ratio between modified SiN and SiN is in the range of 30; by way of example, the etching rate ratio between modified SiN and SiO2 is in the range of 38.

This allows entirely removing the modified portions 31b without consuming the unmodified lateral portions 30l on the flanks 22 of the gate 20, nor consuming the active layer 13.

The performances of the transistors are thus preserved.

According to one embodiment, particularly advantageous when the dielectric layer 3 is made of a material taken from: a silicon nitride, SiC, SiCN, SiCBN, the selective etching of the modified basal portions 31b relative to the unmodified lateral portions 30l comprises a wet etching based on a solution comprising hydrofluoric acid (HF) diluted to x % by mass, with x≤0.2 and having a pH less than or equal to 1.5. Preferably, the pH is less than or equal to 1.3, more preferably less than or equal to 1 and preferably strictly less than 1. The dilution factor x is preferably less than or equal to 0.15, preferably x≤0.1. According to one example, x is substantially equal to 0.1.

Such an etching solution can be obtained by adding at least one of: hydrochloric acid (HCl), sulfuric acid H2SO4, nitric acid HNO3.

Particularly surprisingly, this etching allows significantly increasing the selectivity of the etching of the modified dielectric material relative to materials based on silicon oxide, generally designated SiOy in the present patent application, with y integer greater than or equal to 1.

For example, with the method according to the invention, a selectivity of the etching relative to silicon dioxide is obtained such that for a thickness e1 of etched modified nitride, only a thickness e1/33.7 of silicon dioxide is etched at the same time. This improved selectivity is very advantageous since very often a hard mask 25 on the top 21 of the gate 20 or an isolation trench, based on SiOy, are present during the etching step (FIG. 4E).

It follows that the hard mask or the isolation trenches are not altered by the etching of the spacers E. They can therefore fully play their respective roles.

According to another embodiment, the removal of the modified basal portions is performed by selective dry etching with the semiconductor material. Preferably, the removal of the modified portions 31b, typically made of silicon nitride, is performed by selective dry etching with silicon (Si) and/or silicon oxide (SiO2). For example, to remove 15 nm of modified nitride, a dry etching chemistry based on hydrofluorocarbon species and silicon tetrachloride (SiCl4) for about 30 s can be used.

According to another embodiment, the dry etching is performed in a plasma formed in a confined enclosure from nitrogen trifluoride (NF3) and ammonia (NH3).

Advantageously, the dry etching comprises: an etching step consisting in the formation of solid salts, followed by a step of sublimation of the solid salts. This embodiment allows obtaining a very good selectivity of the etching of the modified nitride relative to the unmodified nitride and to the semiconductor material. In particular, this etching selectivity is much higher (typically a factor of at least 10) than that obtained with a HF solution.

According to another embodiment, the step of removing the modified portions 31b relative to the unmodified portions 30l comprises a dry etching carried out by contacting with a gaseous mixture, preferably only gaseous, comprising at least one first component based on hydrofluoric acid (HF). The hydrofluoric acid transforms the modified portions 31b of the dielectric layer 3 into non-volatile residues, preferably non-volatile at ambient temperature.

Advantageously, the step of removing portions 31b comprises, only after dry etching, a removal of the non-volatile residues at ambient temperature by wet cleaning or thermal sublimation annealing.

Advantageously, the dry etching consumes the modified basal portions 31b of the dielectric layer 3 preferentially to the unmodified lateral portions 301 and to the active layer 13. Thus, the risk of excessive consumption of semiconductor material at the surface of the active layer 13 is reduced or even eliminated.

After removal of the modified basal portions 31b, the spacers E are typically formed by the unmodified lateral portions 30l (FIG. 4E). The method advantageously allows producing spacers E for MOSFET transistors.

The invention is not limited to the previously described embodiments and extends to all the embodiments covered by the claims.

For example, it is possible to increase or decrease the source power to modify the density of created ions. The ion flux of incorporation of light ions in the basal portions can thus be adjusted.

For example, it is possible to increase or decrease the duration of the implementation phases for a constant total duration.

For example, it is possible to increase or decrease the number of implementation phases.

For example, it is possible to increase or decrease the energy of the implantation phases.

According to one example, it is possible to pulse the implantation energy of the light ions during the implantation phases.

The method can be advantageously applied to the production of spacers for nanowire-type 3D architecture transistors.

The invention claimed is:

1. A method for forming spacers of a gate of a transistor located on an active layer made of a semiconductor material, the method comprising:
providing a stack comprising the active layer and the gate, the gate having a top and lateral flanks;
forming a dielectric layer made of a dielectric material covering the gate and at least partially covering the active layer on either side of the gate, the dielectric layer having lateral portions covering the lateral flanks of the gate, and basal portions covering the top and the active layer, the basal portions having a thickness (eb);
anisotropically modifying the basal portions of the dielectric layer by implantation of light ions in a direction parallel to the lateral flanks of the gate, forming modified basal portions based on the modified dielectric material and unmodified lateral portions based on the unmodified dielectric material; and
removing the modified basal portions by selective etching of the modified dielectric material relative to the unmodified dielectric material and relative to the semiconductor material, so as to form the spacers on the lateral flanks of the gate from the unmodified lateral portions,
wherein, before the removing step, the anisotropic modifying step comprises performing n successive implantation phases having corresponding implantation energies $\Gamma i (i=1 \ldots n)$ of the light ions which are distinct from each other, $n \geq 3$, the performing of each implantation phase of then successive implantation phases comprising implanting the light ions at a nominal implantation depth dpi in the basal portions, the nominal implantation depth being different for each of then successive implantation phases, and
wherein each implantation phase is performed using a plasma.

2. The method according to claim 1, wherein the step of performing the n successive implantation phases further comprises modifying the basal portions over an entirety of the thickness.

3. The method according to claim 1, wherein the step of performing the n successive implantation phases further comprises modifying the basal portions so that the modified basal portions have, after the modification, a variation in total concentration of light ions ([H]tot) less than 20% along the thickness.

4. The method according to claim 1, wherein n is equal to 3 and the implantation energies $\Gamma 1, \Gamma 2, \Gamma 3$ are such that $\Gamma 1 \leq 0.5 \cdot \Gamma 2$ and $\Gamma 2 \leq \Gamma 3$.

5. The method according to claim 1,
wherein each implantation phase i of the n successive implantation phases in the performing step further comprises implanting the light ions at a maximum concentration at the nominal implantation depth (dpi), and
wherein the nominal implantation depths are selected such that $dpi = eb \cdot i (i+1)$.

6. The method according to claim 1, wherein the step of anisotropically modifying by the basal portions is performed using inductively coupled or capacitively coupled plasma, based on species forming the light ions, the light ions being hydrogen-based ions.

7. The method according to claim 6, wherein the plasma is formed from dihydrogen and at least one species promoting; dissociation of the dihydrogen to form the light ions, the at least one species being chosen from argon, nitrogen, xenon, and helium.

8. The method according to claim 1, wherein each of the implantation energies (i=1, . . . n) is maintained for a duration $ti \geq 5$ s, so that the n successive implantation phases form bearings of duration ti and the implantation energies $\Gamma i (i=1 \ldots n)$.

9. The method according to claim 1, wherein each of the implantation energies $\Gamma i (i=1 \ldots n)$ are such that $\Gamma i+1 = \Gamma i + \Delta$, with $\Delta$ being an energy pitch such that $\Delta \geq 30$ eV.

10. The method according to claim 1, wherein each of the implantation energies $\Gamma_1(i=1 \ldots n)$ are such that $\Gamma_{i+1}=\Gamma_i+\Delta$, with $\Delta$ being an energy pitch such that $\Delta \geq 50$ eV.

11. The method according to claim 1, wherein each of the implantation energies $\Gamma_i(i=1 \ldots n)$ varies continuously and monotonously between $\Gamma_1$ and $\Gamma_n$ during the step of anisotropically modifying.

12. The method according to claim 1, wherein each of the implantation energies $\Gamma_i(i=1 \ldots n)$ is configured to each last a durations $t_i(i=1 \ldots n) \geq T/2(n+1)$, where T is a total duration of the step of anisotropically modifying.

13. The method according to claim 1, wherein each of the implantation energies $\Gamma_i(i=1 \ldots n)$ is between 20 eV and 300 eV.

14. The method according to claim 1, wherein the n successive implantation phases are performed in increasing order of implantation energy.

15. The method according to claim 1, wherein the n successive implantation phases have an implantation energy variation that is greater than or equal to 20%, such as $0.8 \cdot \Gamma_{i-1} \leq \Gamma_i \leq 1.2 \cdot \Gamma_{i+1}$ with $i=1 \ldots n$.

16. The method according to claim 1, wherein a number of the n successive implantation phases is equal to 6 and the implantation energies $\Gamma_i(i=1 \ldots n)$ are such that $\Gamma_1=50$ eV, $\Gamma_2=100$ eV, $\Gamma_3=150$ eV, $\Gamma_4=200$ eV, $\Gamma_5=250$ eV, and $\Gamma_6=300$ eV, each of the n successive implantation phases being performed for a duration $t_i(i=1 \ldots 6)$ between 2 s and 20 s.

* * * * *